United States Patent [19]

Sher et al.

[11] Patent Number: 5,666,067

[45] Date of Patent: *Sep. 9, 1997

[54] VOLTAGE COMPENSATING CMOS INPUT BUFFER CIRCUIT

[75] Inventors: Joseph C. Sher; Manny K. F. Ma, both of Boise, Id.

[73] Assignee: Micron Technology, Inc., Boise, Id.

[*] Notice: The term of this patent shall not extend beyond the expiration date of Pat. No. 5,578,941.

[21] Appl. No.: 731,148

[22] Filed: Oct. 10, 1996

Related U.S. Application Data

[63] Continuation of Ser. No. 518,546, Aug. 23, 1995, Pat. No. 5,578,941.

[51] Int. Cl.[6] .................. H03K 19/0185; H03K 19/0948
[52] U.S. Cl. .................. 326/34; 326/33; 326/70; 326/83
[58] Field of Search .................. 326/31–34, 83, 326/86–87, 68, 70–71, 121; 327/541, 543, 546, 513

[56] References Cited

U.S. PATENT DOCUMENTS

| | | | |
|---|---|---|---|
| 4,929,853 | 5/1990 | Kim et al. | 326/81 |
| 4,964,084 | 10/1990 | Jung et al. | 365/226 |
| 4,988,897 | 1/1991 | Jeong | 326/32 |
| 5,128,560 | 7/1992 | Chern et al. | 326/83 |
| 5,278,460 | 1/1994 | Casper | 327/542 |
| 5,408,191 | 4/1995 | Han et al. | 326/34 |
| 5,416,366 | 5/1995 | Adachi | 326/33 |
| 5,438,280 | 8/1995 | Sugawara | 326/33 |
| 5,578,941 | 11/1996 | Sher et al. | 326/34 |

Primary Examiner—Edward P. Westin
Assistant Examiner—Jon Santamauro
Attorney, Agent, or Firm—Schwegman, Lundberg, Woessner & Kluth, P.A.

[57] ABSTRACT

A voltage compensating CMOS input buffer converts input TTL signals to CMOS logic levels, and compensates for changing supply voltage by using a n-channel transistor to vary the effective size ratio of pairs p-channel to n-channel transistors making up an input inverter. The compensating transistor becomes operable with increasing supply voltage to help the n-channel input inverter transistors offset the p-channel input inverter transistors whose trip points would otherwise have been increased by increasing power supply voltage. As the power supply voltage decreases, the compensating transistor turns off, returning the input inverter to its original size ratio. The gate of the compensating transistor is coupled to the supply voltage through two diodes to control the amount of current flowing through the compensating transistor. Further trip point transistors in series with the compensating transistor have their gates coupled to the input signals to help stabilize the trip points. An output stage inverter provides the CMOS logic levels from the output of the input inverter.

13 Claims, 1 Drawing Sheet

VOLTAGE COMPENSATING CMOS INPUT BUFFER CIRCUIT

This is a continuation of application Ser. No. 08/518,546, filed Aug. 23, 1995, now U.S. Pat. No. 5,578,941.

FIELD OF THE INVENTION

The present invention relates to a CMOS voltage compensating input buffer circuit formed in a semiconductor integrated circuit (IC) and in particular to a circuit that changes the ratio of p-channel to n-channel pairs based on the power supply voltage level.

BACKGROUND OF THE INVENTION

Standard IC operating input logic high and low voltage levels (VIH and VIL) have been set by industry standards. For DRAM devices in the CMOS family, such levels are typically 0.8 volts plus or minus 100 millivolts for VIL and 2.4 volts plus or minus 100 millivolts for VIH. TTL trip points are usually 2 volts for VIH and 0.8 volts for VIL. In other words, as the input voltage increases to 2 volts and higher, the input is interpreted as a high logic level. As the voltage decreases to 0.8 volts and lower, the input is interpreted as a low logic level. The input signal is subject to noise from other lines via parasitic capacitances and leakage currents, so it is important that the trip points do not drift into the range where false highs or lows may be perceived. TTL logic, however may operate at the mercy of voltage supplies that may vary from less than three volts to at least 7.5 volts which is commonly used for high voltage testing. This varying power supply voltage makes it difficult to ensure that the input will be interpreted by an input buffer as the intended input. In one instance, a VCC supply change from 2.7 Volts to 3.9 Volts resulted in a shift of TTL input trip points in a range of from 490 millivolts to 590 millivolts. There is a need for an input buffer which is able to determine whether an input signal is intended as a high input signal logic level, or a low input signal logic level, even when the VCC voltage level changes.

One prior solution can be seen in U.S. Pat. No. 05,278,460, to Casper. It essentially regulates the voltage supplied to the input buffer by using a voltage variable transistor in series between the supply and the input buffer. As VCC changes, the voltage across the transistor also changes with the change in VCC, effectively keeping the voltage supplied to the input buffer fairly constant. The input buffer comprises an input inverter for receiving the signals and detecting and inverting intended high or low logic levels, and a second inverter for converting the logic levels back to the desired polarity. There is a need for a way to compensate for supply voltage changes without trying to control the voltage supply to the input buffer, while providing stable trip points over drastic changes in supply voltage.

SUMMARY OF THE INVENTION

The present invention provides a way of compensating for supply voltage changes to a CMOS input buffer without precisely regulating the supply voltage itself. A CMOS inverter having p-channel and n-channel transistors in series is used as the input stage of the input buffer. The transistors have a fixed p-channel to n-channel size ratio designed to provide appropriate Vin input trip points at a predetermined supply voltage. The input stage converts input logic levels to an inverted CMOS logic level, and a second stage inverter inverts the level to provide full CMOS logic levels of a high or a low. A voltage compensating circuit coupled between the two stages turns on as the supply voltage, VCC, increases. For a given p-channel to n-channel size ratio, an increase in VCC increases the trip point at which the n-channel devices overcome the p-channel devices, causing a transition to a different logic level. The compensating circuit helps the n-channel devices to overcome the p-channel devices as VCC increases by effectively lowering the size ratio of the p-channel to n-channel inverter pairs of transistors. As VCC decreases, the compensating circuit decreases the current that it will pass, returning the input inverter to its original size ratio.

In one preferred embodiment, the input inverter comprises a first pair of p-channel transistors coupled in series between VCC and the output of the input inverter, and a first pair of n-channel transistors coupled in series between the output and ground or VSS. All gates of the transistors are tied to the input voltage. The voltage compensating circuit is coupled to the output of the input inverter and comprises a n-channel transistor referred to as a compensating transistor having a gate indirectly coupled to VCC. As VCC increases, the compensating transistor turns on, sinking more current from the output of the input inverter to help the first pair of n-channel transistors overcome the p-channel transistors as the input voltage increases toward the VIH trip point. The compensating transistor also prevents the p-channel transistors from overcoming the n-channel transistors as the input voltage decreases toward the VIL trip point. As VCC decreases, the compensating transistor sinks less current.

In a further embodiment, the input to the compensating transistor comprises VCC in series with two diodes to reduce the input to the gate of the compensating circuit by two n-channel Vt drops. The input is also coupled to the drain of a further n-channel transistor having its gate coupled to VCC and source coupled to ground. This ensures that the compensating transistor will turn on only at the right level of increase in VCC. In addition, two n-channel trip point centering transistors are coupled either side of the compensating transistor in series between the output of the input inverter, and ground. The gates of the trip point centering transistors are tied to Vin, and reduce the current flow through the compensating transistor to make the current consumption of the present invention very similar to that of regular input buffers. In fact, during switching the n-channel devices of both the input inverter and the voltage compensation circuit, and the p-channel devices of the input inverter serve as active loads for each other during switching, which sharpens the transfer characteristics, resulting in minimal current flow.

DESCRIPTION OF THE PREFERRED EMBODIMENT

Figure 1:
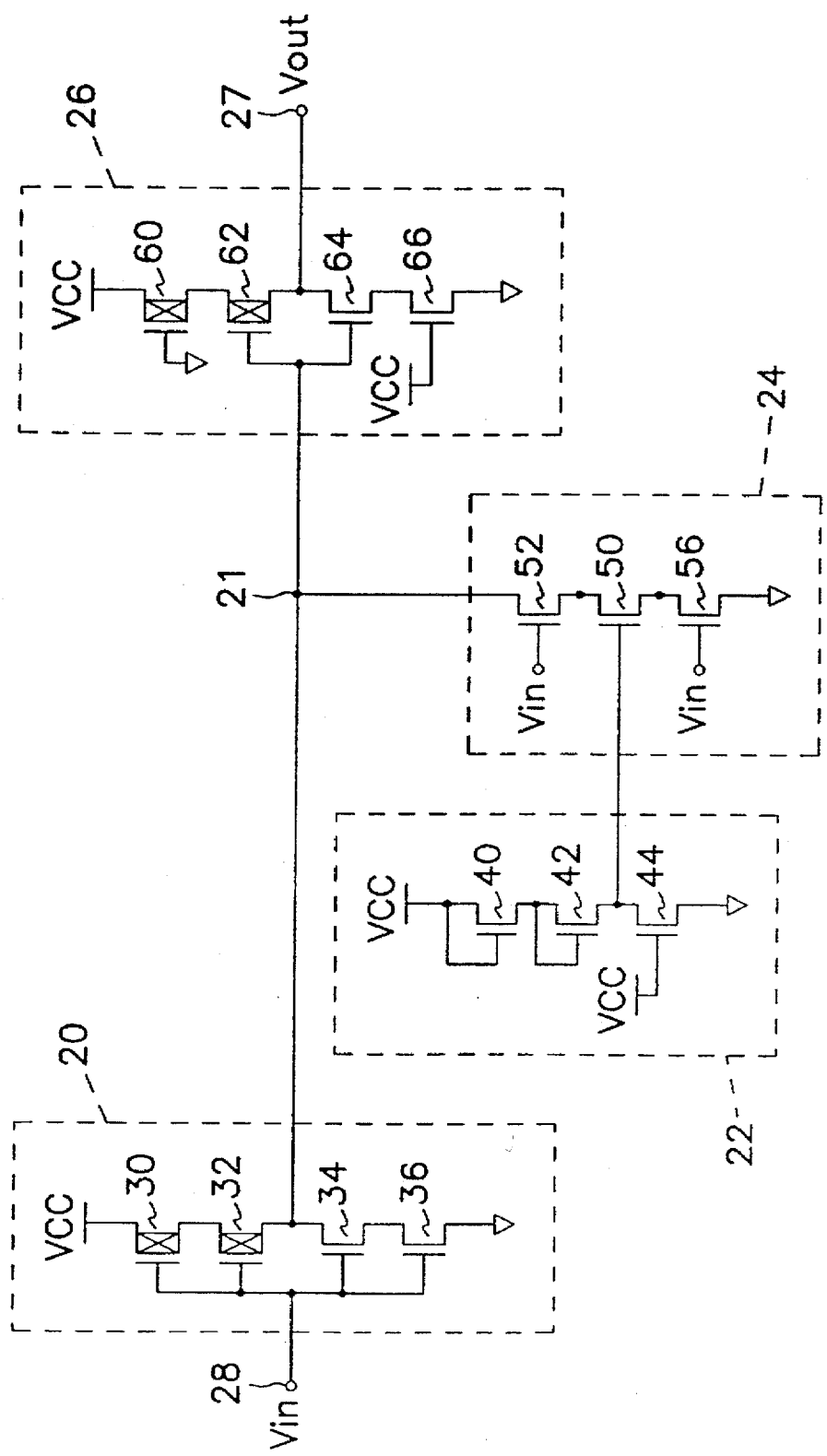
FIG. 1 is a schematic diagram of the voltage compensating CMOS input buffer of the present invention.

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined only by the appended claims.

FIG. 1 is a schematic representation of a voltage compensating CMOS input buffer circuit. Indicated by the broken line at 20, an input inverter has an output at node 21. A Voltage adjusting circuit indicated by the broken line at 22 is coupled to a compensating circuit indicated by the broken line at 24 which is also coupled in series between ground and output node 21. An output inverter indicated by the broken line at 26 is coupled between node 21 and Vout indicated at 27. In one preferred embodiment, an input voltage, Vin, provided to input inverter 20 at input line 28, comprises a TTL level logic signal with TTL trip points of 2.4 volts for VIH and 0.8 volts VIL, usually plus of minus 100 millivolts. The voltage level may be different for different implementations to account for losses in particular circuit layouts. Vout at 27 comprises full CMOS levels with a high of 5 volts and a low of zero volt based on the TTL input signals provided at Vin for a supply voltage of 5 volts.

Input inverter 20 comprises two pair of field effect transistors. A first P-channel transistor at 30 and a second p-channel transistor at 32 comprise a first pair, and first and second n-channel transistors at 34 and 36 comprise the second pair. The source of p-channel transistor 30 is coupled to a supply voltage VCC. Its drain is coupled to the source of p-channel transistor 32 whose drain is coupled to output node 21 of inverter 20. The drain of n-channel transistor 34 is coupled to node 21. Its source is coupled to the drain of n-channel transistor 36 whose source is coupled to ground or other suitable reference potential. The gates of all four transistors are coupled to Vin at input node 28. The p-channel to n-channel size ratio is controlled to provide the desired trip points VIH and VIL for Vin at constant VCC. As VCC increases however, it takes longer for the n-channel devices to overcome the p-channel devices to switch them to an off state, resulting in increasing the voltage levels of the trip points.

Voltage adjusting circuit 22 is designed to provide a control signal to the compensating circuit 24. Voltage adjusting circuit 22 comprises two series coupled diodes 40 and 42 coupled to VCC. The output of the series coupled diodes is coupled to the drain of a third n-channel transistor indicated at 44. The gate of n-channel transistor 44 is coupled to VCC and its source is coupled to ground. As VCC changes, the output of the voltage adjusting circuit 22 which is coupled to the gate of a voltage compensating fourth n-channel transistor 50, also changes and causes the voltage compensating n-channel transistor 50 to turn on as VCC increases and to turn off as VCC decreases. Voltage compensating n-channel transistor 50 in effect sinks current from node 21 assisting transistors n-channel transistor 34 and n-channel transistor 36 in overcoming p-channel transistor 30 and p-channel transistor 32 during increases in VCC, functioning as an active load. As Vin increases toward the trip point VIH, voltage compensating transistor n-channel transistor 50 sinks current from node 21, and helps n-channel transistor 34 and n-channel transistor 36 turn on, causing p-channel transistor 30 and p-channel transistor 32 to turn off. As Vin is decreasing toward VIL, n-channel transistor 50 also assists n-channel transistor 34 and n-channel transistor 36 in resisting p-channel transistor 30 and p-channel transistor 32 from turning them off until the trip point is reached. During actual switching of the input invertor 20, the n-channel devices of both the input invertor 20 and the voltage compensation circuit 24 and the p-channel devices of the input inverter 20 serve as active loads for each other thereby sharpening the transfer characteristics and minimizing current flow. The load provided is approximately directly proportional to the change in supply voltage, but in any event operates to maintain the trip points at fairly constant levels.

A first trip point centering transistor 52 has its drain coupled to node 21 and its source coupled to the drain of compensating transistor n-channel transistor 50. Vin is coupled to the gate of trip point centering transistor n-channel transistor 52. A second trip point centering n-channel transistor 56 has its drain coupled to the source of compensating n-channel transistor 50, and its source coupled to ground or other suitable reference voltage. The gate of trip point centering transistor 56 is coupled to Vin. The trip point centering transistors serve to reduce the current flow through the compensating transistor 50 to make the current consumption of the present invention very similar to that of regular input buffers.

Node 21 is coupled to the input of output inverter 26 which comprises two pair of FET transistors. A pair of p-channel output inverter transistors 60 and 62 are coupled in series with a pair of n-channel output inverter transistor 64 and 66. The source of p-channel transistor 60 is coupled to VCC and its gate is coupled to ground. The drain of p-channel transistor 60 is coupled to the source of p-channel transistor 62 whose gate is coupled to node 21. The drain of p-channel transistor 62 is coupled to the drain of n-channel transistor 64 which also serves as Vout. The gate of n-channel transistor 64 is also coupled to node 21. The source of n-channel transistor 64 is coupled to the drain of n-channel transistor 66 whose gate is coupled to VCC. The source of n-channel transistor 66 is coupled to ground. The output inverter 26 serves to invert the output of the input inverter 20 to provide full CMOS levels of zero volt for low logic levels and 5 volts for high logic levels on Vout line 27 for a VCC of 5 volts.

It should be noted that in many field effect transistors, the source and drain are essentially interchangeable, and interconnections specified herein should not be interpreted as solely limited to those described. In addition, certain transistors were described as n-channel or p-channel transistors. It is recognized by those skilled in the art that such transistors may be switched on essentially a wholesale basis so that those described as p-channel become n-channel and those described as n-channel become p-channel transistors without departing from scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of compensating for supply voltage variations in a CMOS input inverter buffer circuit having complimentary p-channel and n-channel transistors coupled in series between the supply voltage and a reference voltage, said transistors having a channel size ratio selected to provide TTL input trip points at a predetermined supply voltage and switching logic levels of an output based on the level of an input signal reaching said trip points, comprising the steps of:

receiving an input signal;

providing a supply voltage variable active load to at least one of the n-channel and p-channel transistors to stabilize the levels of input signals at which the input inverter switches its output levels when the supply voltage changes; and controlling the flow of current through the active load by use of trip point centering transistors coupled to the input signal and based on the supply voltage.

2. The method of claim 1 and further comprising the step of inverting the output levels to provide CMOS logic levels representative of the input signal.

3. The method of claim 1 wherein the TTL trip points comprise a VIL voltage level of about 0.8 volts and a VIH voltage level of about 2 volts.

4. The method of claim 1 wherein the active load comprises an n-channel voltage compensating transistor.

5. The method of claim 4 and further comprising the steps of:

providing a reduced supply voltage signal; and applying the reduced supply voltage signal to a gate of the n-channel voltage compensating transistor.

6. The method of claim 1 wherein the complimentary p-channel and n-channel transistors comprise a pair of p-channel transistors and a pair of n-channel transistors.

7. A method of providing accurate output logic levels representative of input signals with a varying supply voltage comprising the steps of:

providing the input signal to an input inverter;

providing the input signal to a pair of trip point centering devices;

providing a signal representative of the supply voltage to a compensating device coupled to the trip point centering devices; and drawing current through the compensating device to provide an active load to the input inverter based on the input signal and the supply voltage such that the input inverter provides the proper output logic levels.

8. The method of claim 7 and further comprising the step of reducing the supply voltage by at least one diode drop to provide the signal representative of the supply voltage.

9. The method of claim 7 wherein the active load increases as the supply voltage increases.

10. The method of claim 7 wherein the active load decreases as the supply voltage decreases.

11. The method of claim 7 wherein the active load is varied in direct proportion to a change in supply voltage such that the trip point levels remain fairly constant with change in supply voltage.

12. The method of claim 7 and further comprising the step of inverting the output of the input inverter to provide CMOS logic levels.

13. The method of claim 12 wherein the inverter is responsive to TTL trip points comprising a VIL voltage level of about 0.8 volts and a VIH voltage level of about 2 volts.

* * * * *